United States Patent
Heller (10) Patent No.: US 7,368,659 B2
(45) Date of Patent: May 6, 2008

(54) ELECTRODES MITIGATING EFFECTS OF DEFECTS IN ORGANIC ELECTRONIC DEVICES

(75) Inventor: Christian Maria Anton Heller, Albany, NY (US)

(73) Assignee: General Electric Company, Niskayuna, NY (US)

(*) Notice: Subject to any disclaimer, the term of this patent is extended or adjusted under 35 U.S.C. 154(b) by 430 days.

(21) Appl. No.: 10/065,850

(22) Filed: Nov. 26, 2002

(65) Prior Publication Data
US 2004/0099305 A1    May 27, 2004

(51) Int. Cl.
*H05B 33/26* (2006.01)

(52) U.S. Cl. .................................. 136/263; 257/40

(58) Field of Classification Search ............. 136/263, 136/256, 244; 257/40, 79, 103, 94, 88, 461, 257/464, 457
See application file for complete search history.

(56) References Cited

U.S. PATENT DOCUMENTS

| | | | |
|---|---|---|---|
| 5,294,870 A | 3/1994 | Tang et al. | |
| 5,331,183 A * | 7/1994 | Sariciftci et al. | 257/40 |
| 5,598,803 A | 2/1997 | Czipri | |
| 5,739,635 A * | 4/1998 | Wakimoto | 313/504 |
| 6,004,685 A | 12/1999 | Antoniadis et al. | |
| 6,023,371 A | 2/2000 | Onitsuka et al. | |
| 6,030,715 A | 2/2000 | Thompson et al. | |
| 6,048,630 A | 4/2000 | Burrows et al. | |
| 6,127,693 A | 10/2000 | Chen et al. | |
| 6,133,581 A | 10/2000 | Terao et al. | |
| 6,303,238 B1 | 10/2001 | Thompson et al. | |
| 6,329,084 B1 | 12/2001 | Tamano et al. | |
| 6,329,085 B1 | 12/2001 | Burrows et al. | |
| 6,333,122 B1 | 12/2001 | Furukawa et al. | |
| 6,365,270 B2 | 4/2002 | Forrest et al. | |

(Continued)

FOREIGN PATENT DOCUMENTS

EP    085652    7/1997

(Continued)

OTHER PUBLICATIONS

H. Suzuki et al., "Near-Ultraviolet Electroluminescence from Polysilanes" Thin Solid Films, vol. 331, pp. 64-70 (1998).

(Continued)

*Primary Examiner*—Kaj K. Olsen
(74) *Attorney, Agent, or Firm*—Mary Louise Gioeni; William E. Powell, III (57) ABSTRACT

A compound electrode for organic electronic devices comprises a thin first layer of a first electrically conducting material and a second electrically conducting material disposed on the first layer. In one embodiment, the second electrically conducting material is formed into a plurality of elongated members. In another embodiment, the second material is formed into a second layer. The elongated members or the second layer has a thickness greater than that of the first layer. The second layer is separated from the first layer by a conducting material having conductivity less than at least the material of the first layer. The compound electrode is capable of mitigating adverse effects of defects, such as short circuits, in the construction of the organic electronic devices, and can be included in light-emitting or photovoltaic devices.

12 Claims, 4 Drawing Sheets

U.S. PATENT DOCUMENTS

| | | | |
|---|---|---|---|
| 6,392,250 | B1 | 5/2002 | Aziz et al. |
| 6,403,238 | B1 | 6/2002 | Horhold et al. |
| 6,586,764 | B2 * | 7/2003 | Buechel et al. ............... 257/40 |
| 6,936,761 | B2 * | 8/2005 | Pichler ....................... 136/256 |
| 6,949,878 | B2 * | 9/2005 | Suzuri et al. ............... 313/503 |
| 2002/0190263 | A1 * | 12/2002 | Hata et al. .................. 257/103 |
| 2003/0005955 | A1 * | 1/2003 | Shiotsuka et al. .......... 136/251 |
| 2004/0051444 | A1 * | 3/2004 | Schaepkens et al. ........ 313/504 |

FOREIGN PATENT DOCUMENTS

| | | |
|---|---|---|
| EP | 1215945 | 12/2001 |
| JP | 3054828 A | 7/1989 |
| JP | 10126008 | 10/1996 |
| JP | 10-255982 A * | 9/1998 |
| WO | 0142218 | 6/2001 |
| WO | 0145469 | 6/2001 |

OTHER PUBLICATIONS

I. Seguy et al., "Red Organic Light Emitting Device Made From Triphenylene Hexaester and Perylene Tetraester," Journal of Applied Physics., vol. 89, No. 10, 5442 (2001).

C. Adachi et al., "Electroluminescence Mechanisms in Organic Light-Emitting Devices Employing a Europium Chelate Doped in a Wide Energy Gap Bipolar Conducting Host," Journal of Applied Physics., vol. 87, No. 11, 8049 (2000).

H. Heil et al., "Tris (dibenzoylmethand)(monophenanthroline) europium (III) Based Red Emitting Organic Light Emitting Diodes," Journal of Applied Physics, vol. 90, No. 10, 5357 (2001).

Y. Kawamura et al., "Energy Transfer in Polymer Electrophosphorescent Light Emitting Devices with Single and Multiple Doped Luminescent Layers," Journal of Applied Physics, vol. 92, No. 1, 87 (2002).

P.F. Gordon & P. Gregory, "Organic Chemistry in Colour," Springer-Verlag, Berlin, pp. 99-101, 105-106, 126, 180, 253-255, 257 (1983).

U.S. Appl. No. 09/683,345, A. Duggal et al., "Light-Emitting Device with Organic Electroluminiscent Material and Photoluminescent Materials," Filed Dec. 17, 2001.

GB Search Report—Sep. 27, 2006.

* cited by examiner

ELECTRODES MITIGATING EFFECTS OF DEFECTS IN ORGANIC ELECTRONIC DEVICES

FEDERAL RESEARCH STATEMENT

This invention was first conceived or reduced to practice in the performance of work under contract DE-FC26-00NT40989 awarded by the United States Department of Energy. The United States of America may have certain rights to this invention.

BACKGROUND OF INVENTION

The present invention relates generally to electronic devices that have an active organic layer and at least an electrode having a structure that mitigates the adverse effects of defects resulting from the construction of such devices. In particular, the present invention relates to structures of at least an electrode, which structures mitigate effects of short circuits in such devices.

Organic electroluminescent devices ("OELDs"), which have been recently developed, can provide an attractive and more suitable alternative to inorganic electroluminescent devices in many applications, such as large-area illumination.

An OELD is typically a thin film structure formed on a substrate such as glass or transparent plastic. A light-emitting layer of an organic electroluminescent ("EL") material and optional adjacent organic semiconductor layers are sandwiched between a cathode and an anode. The organic semiconductor layers may be either hole (positive charge)-injecting or electron (negative charge)-injecting layers and also comprise organic materials. The material for the light-emitting layer may be selected from many organic EL materials that emit light having different wavelengths. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to 10 micrometers. To obtain white light, prior-art devices have incorporated closely arranged OELDs emitting blue, green, and red light. These colors are mixed to produce white light. An alternate scheme to produce white light is set forth in U.S. Pat. No. 5,294,870; which describes an organic EL multicolor display device comprising an organic EL source emitting blue light with green- and red-emitting fluorescent materials applied to different subpixel areas. This device emits different colors from the different subpixel areas by color shifting with the green- and red-emitting fluorescent materials. However, the manufacture of such microdevices is complex and requires sophisticated technologies; and, thus, increases cost. Moreover, for general lighting purposes, large-area OELDs must be fabricated. The manufacture of defect-free large-area OELDs is a challenge. Typically, a defect in the fabrication, such as one that allows a short circuit, would render the whole device inoperative and darkened.

Therefore, it is very desirable to provide organic electronic devices, the operation of which is more tolerant to fabrication defects. It is also very desirable to provide organic electronic devices that remain operative even when there are microscopic short circuits in the originally made devices.

SUMMARY OF THE INVENTION

The present invention provides a compound electrode that comprises: (1) a first layer of a first electrically conducting material, and (2) at least a second electrically conducting material disposed on the first layer of the first electrically conducting material. As used herein, the term "compound electrode" means an electrode that comprises distinct elements comprising at least two electrically conducting materials.

The present invention also provides an organic electronic device that comprises an active member that comprises two electrodes and at least an electrically and optically active organic material disposed between the electrodes. At least one of the electrodes is a compound electrode.

According to one aspect of the present invention, the organic electronic device is an OELD, wherein the active member is a light-emitting member, and the active organic material is an organic EL material.

According to another aspect of the present invention, the organic electronic device is an organic photovoltaic ("PV") device, wherein the active member converts EM radiation to electrical energy, and the active organic material is an organic PV material.

According to still another aspect of the present invention, the second electrically conducting material of the compound electrode comprises a plurality of elongated members having a thickness greater than that of the first layer of the first electrically conducting material.

According to another aspect of the present invention, the second electrically conducting material comprises a second layer having a thickness greater than that of the first layer, the second layer being separated from the first layer by a layer of an electrically conducting material having conductivity less than those of the first and second electrically conducting materials.

The present invention also provides a method for producing an organic electronic device. The method comprises the steps of: (a) providing a first electrode; (b) disposing at least a layer of an organic active material on the first electrode; (c) disposing a first layer of a second electrode on the layer of organic active material, the first layer of the second electrode comprising a first electrically conducting material; and (d) disposing a second electrically conducting material on the first electrically conducting material.

According to another aspect of the present invention, the second electrically conducting material is formed into a plurality of elongated members having a thickness greater than that of the first layer of the second electrode.

According to still another aspect of the present invention, the method for producing an organic electronic device further comprises the step of disposing an electrically conducting organic material on the first layer of the second electrode, the electrically conducting organic material separating the first and second electrically conducting materials.

Other features and advantages of the present invention will be apparent from a perusal of the following detailed description of the invention and the accompanying drawings in which the same numerals refer to like elements.

DETAILED DESCRIPTION

The present invention provides an organic electronic device that can be included in a light-emitting device, a light source, a display, a PV device, or an electrical source comprising an organic PV device. The structure of at least one electrode of an organic electronic device of the present invention can mitigate the adverse effects of defects in the fabrication of the device. Thus, the present invention allows for a higher yield of usable devices in the manufacturing process. In particular, the structure allows for a continued operation of the organic electronic device even after one or more short circuits occur at points on the electrodes.

According to one aspect of the present invention, the organic electronic device is an OELD that typically comprises at least an organic EL material disposed between two electrodes: an anode and a cathode. The organic EL material is typically formed into a layer having a thickness less than about 1 micrometer, preferably less than about 0.5 micrometer. As the thickness of the organic EL layer is decreased, the applied voltage can be advantageously reduced at constant current density, or the current density can be advantageously increased at constant applied voltage. However, as the thickness of the organic EL layer is decreased, the probability for short circuits through defects in the organic EL layer increases. Such defects can be in the form of, for example, pin holes, scratches, conducting impurities, etc. Typically, once a short circuit occurs, the entire OELD becomes non-operative and non-emitting because the current preferentially flows through the short circuit and bypasses the organic EL material. Such short circuits can be avoided by decreasing the thickness of one of the electrodes such that heat generated at the point of contact between the electrodes is adequate to ablate a small area of the thinner electrode around the point of contact. After this ablation of part of the thinner electrode, the short circuit is eliminated, and the current again flows through the organic EL layer, providing light emission. However, as the thickness of an electrode decreases, the sheet resistance increases; thus, requiring a higher applied voltage. Typically, a sheet resistance less than about 100 ohms/square, preferably less than 50 ohms/square, is desirable. Metal electrodes, thus, typically have a thickness from about 25 nm to about 500 nm. A thickness of much less than 25 nm would result in undesirably high sheet resistance.

The present invention provides an OELD having a structure of at least an electrode that allows for ease of ablation of a small area of a thin electrode around a short circuit, but avoids an excessive increase in the sheet resistance of this electrode. Such an electrode comprises a first layer of a first electrically conducting material, and a second electrically conducting material disposed on the first layer of the first electrically conducting material. The first and second electrically conducting materials can be the same or different materials.

Figure 1:
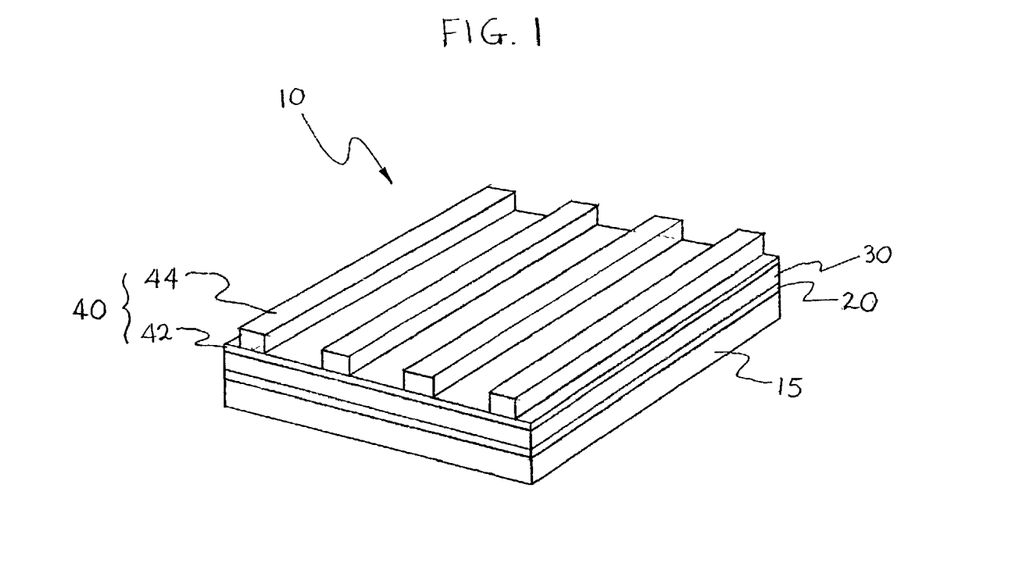
FIG. 1 is a perspective of a device wherein a compound electrode comprises a first layer and a plurality of elongated members disposed thereon.

FIG. 1 illustrates the first embodiment of the present invention. It should be understood that the drawings accompanying this disclosure are not drawn to scale. OELD 10 comprises a substrate 15 of a substantially transparent material, a first electrode 20 disposed on substrate 15, at least a layer 30 of an organic EL material disposed on first electrode 20, and a second electrode 40 disposed on organic EL layer 30. Substrate 15, first electrode 20, and organic EL layer 30 will be disclosed in more detail below. At least one of electrodes 20 and 40 is a compound electrode. In the first embodiment, second electrode 40 is a compound electrode that comprises a first layer 42 and a plurality of elongated members 44 disposed on first layer 42. First layer 42 is made of a first electrically conducting material, and typically has a thickness from about 1 nm to about 25 nm, preferably from about 1 nm to about 10 nm. Elongated members 44 are made of a second electrically conducting material that can be the same material as or different than the material of first layer 42. Each of the elongated members 44 has a thickness of about 10-500 nm, measured substantially perpendicularly to the first layer. The total surface area of the elongated members overlapping the first layer is less than about 50 percent, preferably less than 25 percent, and more preferably less than 10 percent, of the surface area thereof. Although FIG. 1 shows straight elongated members, they can have other shapes provided one dimension is many times, for example at least ten times, another dimension.

Figure 2:
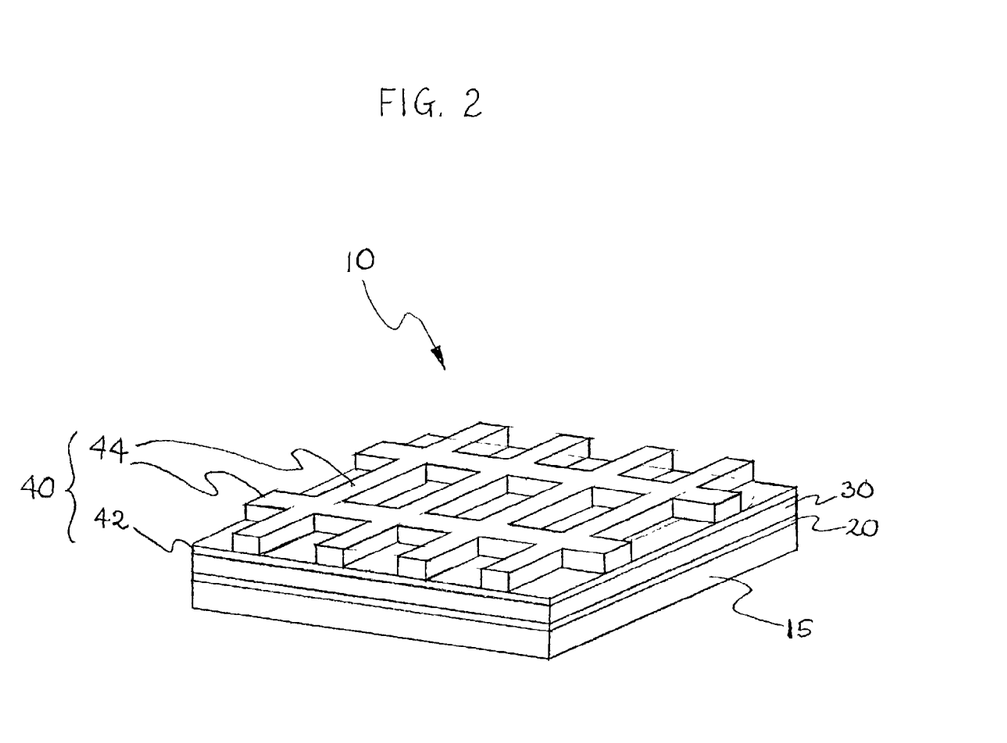
FIG. 2 is a perspective of a device wherein a compound electrode comprises a first layer and a plurality of elongated members forming an intersecting mesh disposed thereon.

Alternatively, the plurality of elongated members 44 can form a network of intersecting lines, such as illustrated in FIG. 2.

Compound electrode 40 can be an anode or a cathode of OELD 10. Preferably, compound electrode 40 is the cathode injecting negative charge carriers (electrons) into organic layer 30. The first and second electrically conducting materials have low work function; e.g., less than about 4 eV, such as K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode 40 are Ag—Mg, Al—Li, In—Mg, and Al—Ca alloys. For example, first layer 42 of compound cathode 40 is a layer of Ca having a thickness from about 1 nm to about 10 nm, and elongated members 44 have a thickness from about 10 nm to about 100 nm and are made of silver. First layer 42 can comprises a stack of plurality of sublayers, each comprising a different electrically conducting material, as long as the total thickness of first layer 42 is kept sufficiently small, such as in the range from about 1 nm to about 10 nm, such that current flow through the short circuit is interrupted by, for example, an ablation of a small area around a short-circuit defect. Other modes of current flow interruption also are possible, such as delamination between layers 30 and 42 around an area around the short circuit because of, for example, heat generated by such a short circuit.

First layer 42 can be deposited on organic EL layer by physical vapor deposition, chemical vapor deposition, or sputtering. Elongated members 44 can be deposited on first layer 42 by physical vapor deposition, chemical vapor deposition, or sputtering, with the use of a mask. Alternatively, a thick layer of the second electrically conducting material can be deposited on first layer 42, and the layer of the second conducting material is etched to leave a plurality of elongated members 44. In still another alternative embodiment, a thin first layer 42 and a thicker layer of the second electrically conducting material can be laminated together such that the two layers form a conducting interface. The thicker layer of the second electrically conducting material is etched to leave a plurality of elongated members 44.

Figure 3:
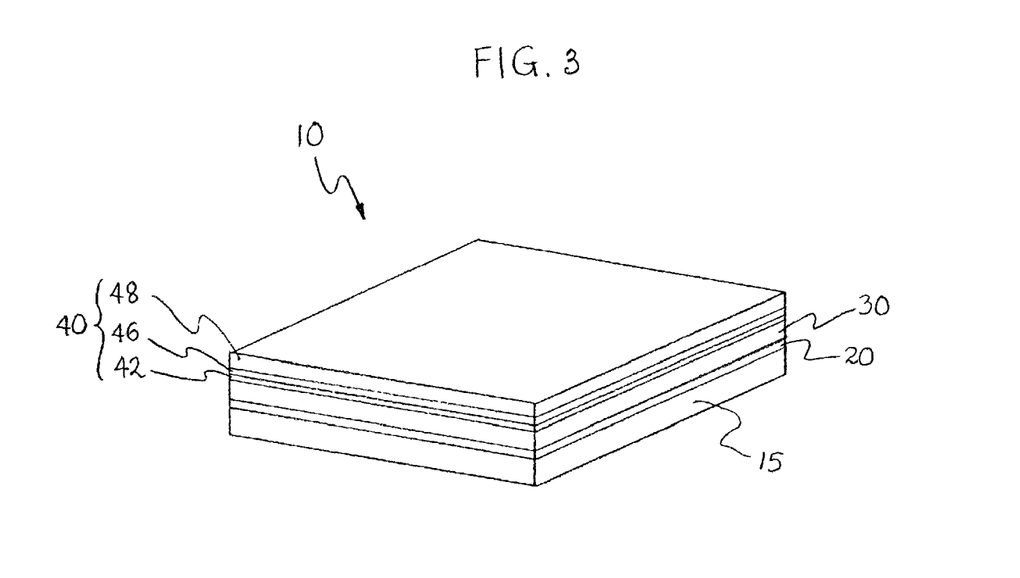
FIG. 3 is a perspective of a device wherein a compound electrode comprises first and second layers separated by a third layer.
Figure 4:
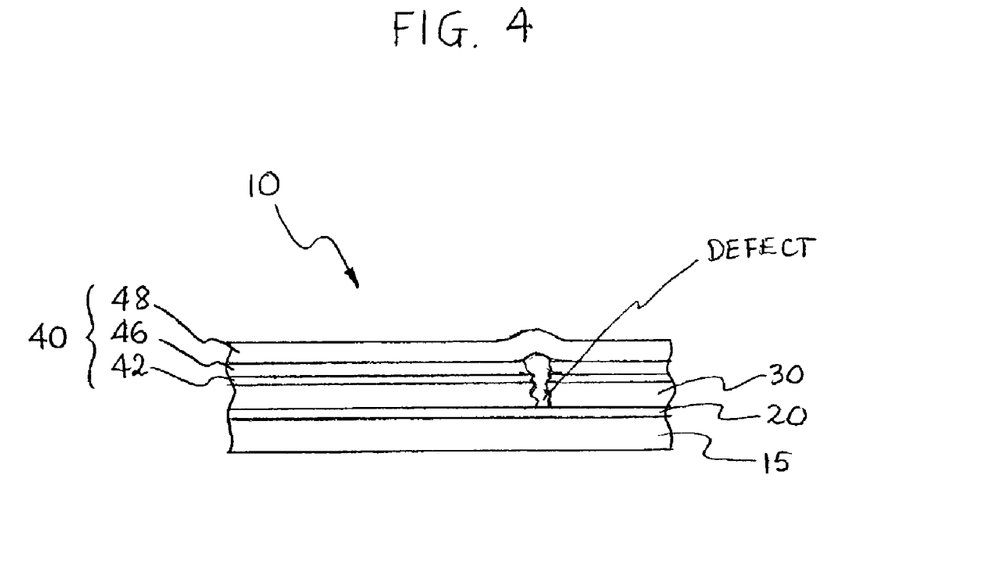
FIG. 4 is a cross section of a device of FIG. 3 showing a separation of the second layer from the underlying layers after a short circuit at a defect.

FIG. 3 illustrates a second embodiment of the present invention. Compound electrode 40 comprises a first layer 42 of a first electrically conducting material disposed on organic EL layer 30, a second layer 46 of a second electrically conducting material, such as a conducting organic material, disposed on first layer 42, and a third layer 48 disposed on second layer 46. First layer 42 comprises a low work-function material, such as those disclosed above. First layer 42 has a thickness from about 1 nm to about 25 nm, preferably form about 1 nm to about 10 nm. Second layer 46 should have a low thermal conductivity but sufficient electrical conductivity. Third layer 48 can, but does not necessarily, comprise a low work-function material. Third layer 48 has a thickness greater than that of first layer 42, in the range from about 10 nm to about 200 micrometers, preferably from about 10 nm to about 1 micrometer, and more preferably from about 10 nm to about 500 nm. For example, first layer 42 is a thin layer of Ca having a thickness from about 1 nm to about 10 nm, and third layer 48 is a layer of silver having a thickness from about 10 nm to about 500 nm. Second layer 46 is sandwiched between first layer 42 and third layer 48, and typically comprises a moderately electrically conducting organic material; for example, poly (3,4-ethylenedioxythiophene) doped with polystyrene sulphonic acid ("PEDOT:PSS"). The material for this layer should have conductivity less than those of layers 42 and 48. Other suitable materials for layer 46 are organometallic materials, such as metalloporphyrins, copper phthalocyanine, or 8-hydroxyquinoline aluminum. The thickness of layer 46 is typically in the range from about 10 nm to about 100 nm, preferably from about 10 nm to about 50 nm, and more preferably from about 10 nm to about 30 nm. At a point defect in organic EL layer 30, a short circuit is established between anode 20 and first layer 42 of cathode 40, and heat is generated when a voltage is applied across the electrodes. Such heat generation rapidly ablates a small area of first layer 42 around the point defect and a small area of second layer 46 above it, generating an amount of gas that pushes an area of third layer 48 above it away from the underlying layers so that a short circuit between the electrodes is eliminated. FIG. 4 shows schematically the cross section of the device at the point defect after such an ablation has occurred. A small area in first layer 42 and second layer 46 around the point of short circuit is ablated, generating an amount of gas. Since this gas cannot rapidly escape, its pressure pushes third layer 48 outward and away from the defect. Therefore, the second electrode now no longer has a point of contact with the first electrode. Thus, the short circuit is eliminated.

First and third layer 42 and 48 can be deposited by physical vapor deposition, chemical vapor deposition, or sputtering. Organic layer 46 can be deposited by physical vapor deposition, chemical vapor deposition, spin coating, dip coating, spraying, or ink-jet printing.

The other components of OELD 10 are now described.

Substrate 40 may be a single piece or a structure comprising a plurality of adjacent pieces of different materials and has an index of refraction (or refractive index) in the range from about 1.05 to about 2.5, preferably from about 1.1 to 1.55. Preferably, substrate 40 is made of a substantially transparent glass or polymeric material. Examples of suitable polymeric materials are PET, polyacrylates, polycarbonates, polyesters, polysulfones, polyetherimides, silicone, epoxy resins, and silicone-functionalized epoxy resins. In one embodiment of the present invention, the PL material may be dispersed in the substrate material. The term "substantially transparent" means allowing at least 80 percent, preferably at least 90 percent, and more preferably at least 95 percent, of light in the visible wavelength range transmitted through a film having a thickness of about 0.5 micrometer at an incident angle less than about 10 degrees.

When electrode 40 is the cathode, electrode layer 20 is the anode and is made of a material having a high work function; e.g., greater than about 4.5 eV, preferably from about 5 eV to about 5.5 eV. Indium tin oxide ("ITO") is typically used for this purpose. ITO is substantially transparent to light transmission and allows light emitted from organic electroluminescent layer 30 easily to escape through the ITO anode layer without being seriously attenuated. Other materials suitable for use as the anode layer are tin oxide, indium oxide, zinc oxide, indium zinc oxide, zinc indium tin oxide, antimony oxide, and mixtures thereof. Electrode layers 22 and 38 may be deposited on the underlying element by physical vapor deposition, chemical vapor deposition, or sputtering. A thin, substantially transparent layer of a metal is also suitable. The thickness of electrode layer 20 is typically in the range from about 50 nm to about 400 nm, preferably from about 50 nm to about 200 nm. Electrode layer 20 can be deposited on substrate 15 by physical vapor deposition, chemical vapor deposition, or sputtering. Electrode layers 20 and 40 inject opposite charge carriers into organic EL layer 30, wherein the charge carriers combine to form excitons of high energy, which drop to a lower energy state, concurrently emitting EM radiation in the visible spectrum.

Organic EL layer 30 comprises at least an organic EL material that electroluminesces in the range from near ultraviolet ("UV") to red visible light (i.e., wavelength in the range from about 300 nm to about 770 nm). When the organic EL material emits radiation in the UV range, one or more photoluminescent materials (or phosphors) can be disposed in the vicinity of; e.g., in the path of EM radiation emitted by, the organic EL layer 30 to convert the UV radiation into visible light. The thickness of the organic EL layer 30 is preferably kept in the range of about 100 to about 300 nm. The organic EL material may be a polymer, a copolymer, a mixture of polymers, or lower molecular-weight organic molecules having unsaturated bonds. Such materials possess a delocalized π-electron system, which gives the polymer chains or organic molecules the ability to support positive and negative charge carriers with high mobility.

Suitable blue light-emitting EL polymers are poly(N-vinylcarbazole) ("PVK", emitting violet-to-blue light in the wavelengths of about 380-500 nm); poly (alkylfluorene) such as poly(9,9-dihexylfluorene) (410-550 nm), poly(dioctylfluorene) (wavelength at peak EL emission of 436 nm), or poly{9,9-bis(3,6-dioxaheptyl)-fluorene-2,7-diyl} (400-550 nm); poly(praraphenylene) derivatives such as poly(2-decyloxy-1,4-phenylene) (400-550 nm). Mixtures of these polymers or copolymers based on one or more of these polymers and others may be used to tune the color of emitted light.

Another class of suitable EL polymers emitting blue light is the polysilanes. Polysilanes are linear silicon-backbone polymers substituted with a variety of alkyl and/or aryl side groups. They are quasi one-dimensional materials with delocalized σ-conjugated electrons along polymer backbone chains. Examples of polysilanes are poly(di-n-butylsilane), poly(di-n-pentylsilane), poly(di-n-hexylsilane), poly (methylphenylsilane), and poly{bis(p-butylphenyl)silane} which are disclosed in H. Suzuki et al., "Near-Ultraviolet Electroluminescence From Polysilanes," 331 Thin Solid Films 64-70 (1998). These polysilanes emit light having wavelengths in the range from about 320 nm to about 420 nm.

Organic materials having molecular weight less than about 5000 that are made of a large number of aromatic units are also applicable blue light-emitting materials. An example of such materials is 1,3,5-tris{n-(4-diphenylaminophenyl) phenylamino} benzene, which emits light in the wavelength range of 380-500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415-457 nm, aluminum-(picolymethylketone)-bis{2,6-di(t-butyl)phenoxide} or scandium-(4-methoxy-picolylmethylketone)-bis(acetylacetonate), which emits in the range of 420-433 nm.

Other organic EL materials have emission peak in the wavelength range from about 480 nm to 600 nm. Examples of these materials are chelated oxinoid compounds, such as tris(8-quinolinol)aluminum, bis(8-quinolinol)magnesium, bis(benzo-8-quinolinol)zinc, bis(8-quinolinol)aluminum oxide, tris(8-quinolinol)indium, tris(5-methyl-8-quinolinol) aluminum, 8-quinolinol lithium, tris(5-chloro-8-quinolinol) gallium, bis(5-chloro-8-quinolinol)calcium, tris(5,7-dichloro-8-quinolinol) aluminum, and tris(5,7-dibromo-8-hydroxyquinolinol)aluminum.

Still other organic EL materials have peak emission in the wavelength range from about 550 nm to about 700 nm. Examples of these materials are poly{2-methoxy-5(2'-ethylhexyloxy)-1,4-phenylene-1,2-ethenylene-2,5-dimethoxy-1,4-phenylene-1,2-ethenylene}; dibenzotetraphenylperiflanthene; polythiophene; perylene tetraesters; triphenylene hexaethers; amino-substituted perylene derivatives; azlactone derivatives; derivatives of pentacene; derivatives of pyran; porphyrins of platinum, palladium, europium, or zinc; malenitriledithiolate phosphonate complexes of platinum, palladium, or zinc; derivative of europium (III) phenanthroline, such as europium (III) tris-thenoyltrifluoroacetone-1,10-phenanthroline, europium (III) tris (dibenzoylmethane)(monophenantholine); and iridium (III) bis{2-(2'-benzothienyl)-pyridinato-N-C$^{3'}$}(acetylacetonate).

The organic EL material can be deposited on electrode 20, as a neat material, by physical vapor deposition, chemical vapor deposition, spin coating, dip coating, spraying, or ink-jet printing. Alternatively, the organic material can be dispersed in a film-forming material, and the mixture is deposited by one of the aforementioned methods. Suitable film-forming materials are substantially transparent polyacrylates, polycarbonates, polyethylene terephthalate ("PET"), polyesters, polysulfones, polyetherimides, silicone, epoxy, or derivatives thereof. Other suitable materials that can be mixed into the organic EL layer are electron transporting materials described below.

Figure 5:
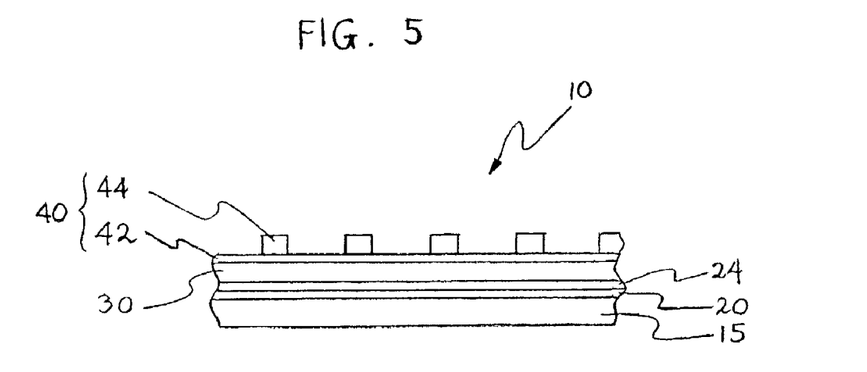
FIG. 5 is a cross section of a device including a hole injection enhancement layer.

Beside organic EL layer 30, one or more additional organic layers may be included between electrodes 20 and 40 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below about 500 nm, preferably below about 100 nm. Materials for these additional layers are typically low-to-intermediate molecular weight (less than about 2000) organic molecules. They may be applied during the manufacture of the device 10 by conventional methods such as spray coating, dip coating, or physical or chemical vapor deposition. In one embodiment of the present invention, as shown in FIG. 5, a hole injection enhancement layer 24 is formed between anode layer 20 and organic EL layer 30 to provide a higher injected current at a given forward bias and/or a higher maximum current before the failure of the device. Thus, hole injection enhancement layer 24 facilitates the injection of holes from the anode. Suitable materials for hole injection enhancement layer 24 are arylene-based compounds, such as 3,4,9,10-perylenetetra-carboxylic dianhydride or bis(1,2,5-thiadiazolo)-p-quinobis(1,3-dithiole).

Figure 6:
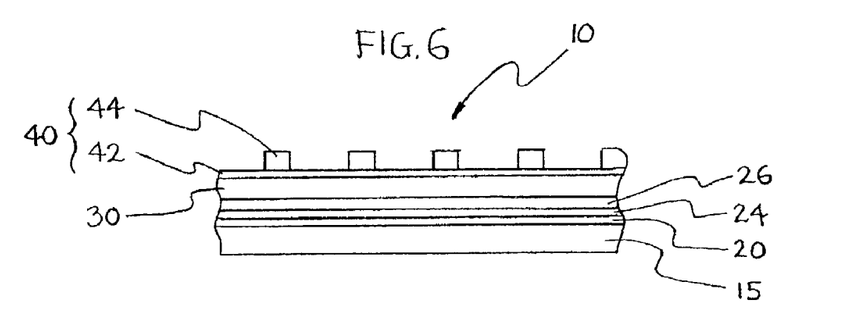
FIG. 6 is a cross section of a device including a hole injection enhancement layer and a hole transport layer.

In another embodiment of the present invention, as shown in FIG. 6, a hole transport layer 26 is disposed between hole injection enhancement layer 24 and organic EL layer 30. Hole transport layer 26 has the functions of transporting holes and blocking the transportation of electrons so that holes and electrons are optimally combined in organic EL layer 30. Materials suitable for hole transport layer 26 are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes.

Figure 7:
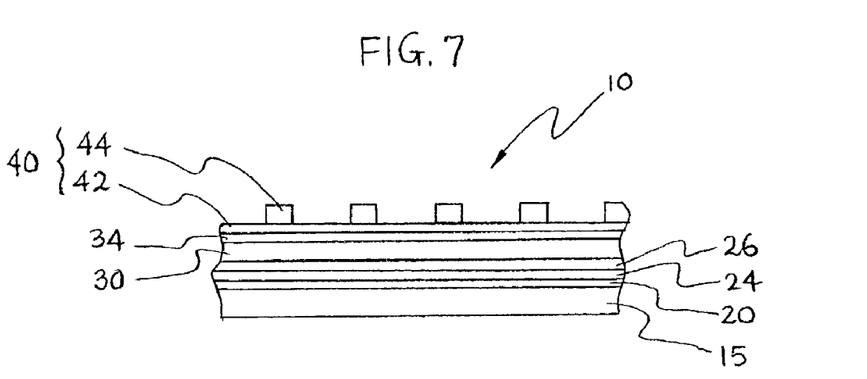
FIG. 7 is a cross section of a device including a hole injection enhancement layer, a hole transport layer, and an electron injection and transport layer.

In still another embodiment of the present invention, as shown schematically in FIG. 7, an additional layer 34 is disposed between first layer 42 of cathode 40 and organic EL layer 30. Layer 34 has the combined function of injecting and transporting electrons to organic EL layer 30. Materials suitable for the electron injecting and transporting layer are metal organic complexes of 8-hydroxyquinoline, such as tris(8-quinolinolato)aluminum; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorene derivatives; and triazines.

According to another aspect of the present invention, the organic electronic device is an organic PV device that is capable of converting EM radiation to electrical energy. The active layer of an organic PV device comprises a heterojunction formed between two organic semiconducting materials: an electron donor, and an electron acceptor. Materials disclosed above can be used for the formation of the double layer and the heterojunction. Suitable electron donor materials are electron injection or transporting materials disclosed above. Suitable electron acceptor materials are hole-injection and enhancement or hole transport materials disclosed above. Photoabsorption in the active organic materials creates an excited electron-hole pair, which moves to the heterojunction where charge separation and a directional flow of charges occur.

A method of making an organic electronic device is now described. A substrate such as a large-area piece of glass or plastic is first provided. A first electrically conducting material is deposited on one surface of the substrate to form a first electrode. The first electrode may be an anode or a cathode, and one or more appropriate materials are chosen among those disclosed earlier for the electrodes. The first electrode material preferably sputter-deposited on the substrate. Furthermore, the first electrode may be patterned to a desired configuration by, for example, etching.

In one embodiment, an active organic material, such as an organic EL material, is deposited in a layer on the first electrode by physical or chemical vapor deposition, spin coating, dip coating, spraying, ink-jet printing, or casting, followed by polymerization, if necessary, or curing of the material. The organic EL material may be diluted in a solvent to adjust its viscosity or mixed with another polymeric material that serves as a film-forming vehicle. An electron transporting material selected from among those disclosed above can also be mixed with the organic EL material either alone or in a mixture with the film-forming polymer. A first electrically conducting material of the second electrode, which is a compound electrode, is deposited by physical vapor deposition, chemical vapor deposition, or sputtering on the organic EL layer to form the first layer of the second electrode. Then, a plurality of elongated members of a second electrically conducting material of the second electrode are formed on the first layer of the second electrode by physical vapor deposition, chemical vapor deposition, or sputtering with the use of a mask. Alternatively, a second thick layer of the second electrically conducting material of the second electrode is formed on the first layer of the second electrode. Then, the second layer is etched to leave behind a plurality of elongated members. As still another alternative, the first layer and the second layer are laminated together such that the layers have an electrical continuity. The combined first and second layers are laminated to the organic EL layer. The second layer is etched or otherwise patterned to leave behind a plurality of elongated members. The second layer may be patterned before or after the combined first and second layers are laminated to the organic EL layer.

In another embodiment of the present invention, a second layer of the second electrode, which second layer is made of a second conducting material, is deposited on the first layer of the second electrode. Preferably, the second conducting material is a conducting organic material, such as one of the conducting organic materials disclosed above. Then, a third layer of a third electrically conducting material, which can be the same as or different than the first electrically conducting material, is deposited on the second layer of the compound electrode. The first and third layers of the compound electrode can be deposited by physical vapor deposition, chemical deposition, or sputtering. The second layer of the compound electrode can be deposited by physical vapor deposition, chemical vapor deposition, spin coating, dip coating, spraying, or ink-jet printing. Preferably, the third layer is thicker than the first layer.

An organic electronic device of the present invention can advantageously be encapsulated in a protective barrier to prevent diffusion of reactive species from the environment into sensitive elements of the device, such as the organic layers or the cathode. Such a protective barrier can comprise an organic encapsulant; such as a substantially transparent polymer, for example, epoxy or silicone. The protective barrier can also comprise a plurality of alternating organic and inorganic materials. The organic materials can be selected from the group consisting of polyacrylates, polycarbonates, PET, epoxy, silicone, silicone-functionalized epoxy, polyetherimides, and polysulfones. The inorganic materials can be selected from the group consisting of metals, metal nitrides, metal carbides, metal borides, metal silicides, or mixtures thereof.

Several OELDs of the present invention may be disposed on a support to provide a light source for general illumination, or to display desired messages or signs.

Alternatively, several organic PV devices of the present invention may be integrated together on a support to provide a source of electrical energy from absorbed EM radiation.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

The invention claimed is:

1. An organic electronic device comprising:
a first electrode;
a second electrode that comprises a first layer of a first electrically conducting material comprising an alloy of Al with at least one low work function metal or a zero valent metal selected from K, Li, Na, Mg, La, Ce, Ca, Sr, Ba, Sm, Eu, an alloy thereof, or a mixture thereof, and a plurality of electrically interconnected elongated members of a second electrically conducting material comprising Mg, Al, Ag, In, Sn, Zn, Zr, an alloy thereof, or a mixture thereof, said elongated members being disposed on and in electrical contact with said first layer; and
at least an electrically and optically active organic material disposed between said first electrode and said first layer of said second electrode, on a surface of said first layer opposite to the plurality of electrically interconnected elongated members.

2. The organic electronic device of claim 1, wherein a thickness of said elongated members is greater than a thickness of said first layer, said thickness of said elongated members being measured substantially perpendicularly to said first layer.

3. The organic electronic device of claim 1, wherein said elongated members form intersecting lines.

4. The organic electronic device of claim 1, wherein a total surface area of said elongated members overlapping said first layer is less than about 50 percent of a surface area of said first layer.

5. The organic electronic device of claim 1, wherein a total surface area of said elongated members overlapping said first layer is less than about 25 percent of a surface area of said first layer.

6. The organic electronic device of claim 1, wherein a total surface area of said elongated members overlapping said first layer is less than about 10 percent of a surface area of said first layer.

7. The organic electronic device of claim 1, wherein an area surrounding a point of short circuit in said first layer is capable of being ablated by heat generated by said short circuit.

8. The organic electronic device of claim 1, wherein said device is an organic electroluminescent device ("OELD"), said first electrode is an anode, said second electrode is a cathode, and said electrically and optically active organic material is an organic EL material.

9. The organic electronic device of claim 8, wherein said thickness of said first layer is in a range from about 1 nm to about 25 nm, and said thickness of said elongated members is in a range from about 10 nm to about 500 nm.

10. The organic electronic device of claim 8, wherein said organic EL material is selected from the group consisting of poly(N-vinylcarbazole); poly(9,9-dihexylfluorene); poly(dioctylfluorene); poly{9,9-bis(3,6-dioxaheptyl)-fluorene-2,7-diyl}; poly(2-decyloxy-1,4-phenylene); poly(di-n-butylsilane); poly(di-n-pentylsilane); poly(di-n-hexylsilane); poly(methylphenylsilane); poly{bis(p-butylphenyl)silane}; 1,3,5-tris{n-(4-diphenylaminophenyl)phenylamino}benzene; tetphenylanthracene; tetraarylethene; coumarin; rubrene; tetraphenylbutadiene; anthracene; perylene; coronene; aluminum-acetylacetonate; gallium-acetylacetonate; indium-acetylacetonate; aluminum-(picolymethylketone)-bis{2,6-di(t-butyl)phenoxide}; scandium-(4-methoxy-picolylmethylketone)-bis(acetylacetonate); chelated oxinoid compounds; poly{2-methoxy-5(2'-ethyl-hexyloxy)-1,4-phenylene-1,2-ethenylene-2,5-dimethoxy-1,4-phenylene-1,2-ethenylene}; dibenzotetraphenylperiflanthene; polythiophene; perylene tetraesters; triphenylene hexaethers; amino-substituted perylene derivatives; azlactone derivatives; derivatives of pentacene; derivatives of pyran; porphyrins of platinum, palladium, europium, or zinc; malenitriledithiolate phosphonate complexes of platinum, palladium, or zinc; derivative of europium (III) phenanthroline; and iridium (III) bis{2-(2'-benzothienyl)-pyridinato-N-$C^{3'}$}(acetylacetonate).

11. An OELD comprising:
(a) a first electrode;
(b) a second electrode that comprises a first layer of a first electrically conducting material, and a plurality of electrically interconnected elongated members comprising a second electrically conducting material, said elongated members being disposed on said first layer; and
(c) at least an organic EL material disposed between said first electrode and said first layer of said second electrode on a surface of said first layer opposite to the plurality of electrically interconnected elongated members;
wherein said first electrode comprises a substantially transparent electrically conducting material; said first electrically conducting material of said second electrode is selected from the group consisting of K, Li, Na, Mg, La, Ce, Ca, Ba, Sm, Eu, alloys thereof, and mixtures thereof, and said second electrically conducting material of said second electrode is selected from the group consisting of Mg, Al, In, Sn, Zn, Zr, alloys thereof, and mixtures thereof; said first layer of said second electrode has a thickness in a range from about 1 nm to about 25 nm; said elongated members have a thickness in a range from about 10 nm to about 500 nm, said thickness being measured substantially perpendicularly to said first layer of said second electrode; and said at least an organic EL material is selected from the group consisting of poly(N-vinylcarbazole); poly(9,9-dihexylfluorene); poly(dioctylfluorene); poly{9,9-bis(3,6-dioxaheptyl)-fluorene-2,7-diyl}; poly(2-decyloxy-1,4-phenylene); poly(di-n-butylsilane); poly(di-n-pentylsilane); poly(di-n-hexylsilane); poly(methylphenylsilane); poly{bis(p-butylphenyl)silane}; 1,3,5-tris{n-(4-diphenylaminophenyl)phenylamino}benzene; phenylanthracene; tetraarylethene; coumarin; rubrene; tetraphenylbutadiene; anthracene; perylene; coronene; aluminum-acetylacetonate; gallium-acetylacetonate; indium-acetylacetonate; aluminum-(picolymethylketone)-bis{2,6-di(t-butyl)phenoxide}; scandium-(4-methoxy-picolyl methylketone)-bis(acetylacetonate); chelated oxinoid compounds; poly{2-methoxy-5(2-ethyl-hexyloxy)-1,4-phenylene-1,2-ethenylene-2,5-dimethoxy-1,4-phenylene-1,2-ethenylene}; dibenzotetraphenylperiflanthene; polythiophene; perylene tetraesters; triphenylene hexaethers; amino-substituted perylene derivatives; azlactone derivatives; derivatives of pentacene; derivatives of pyran; porphyrins of platinum, palladium, europium, or zinc; malenitriledithiolate phosphonate complexes of platinum, palladium, or zinc; derivative of europium (III) phenanthroline; and iridium (III) bis{2-(2'-benzothienyl)-pyridinato-N-$C^{3'}$}(acetylacetonate).

12. A right source comprising a plurality of organic electroluminescent devices ("OELDs") disposed on a support, each of said OELDs comprising:
(a) a first electrode;
(b) a second electrode that comprises a first layer of a first electrically conducting material comprising at least one metal or alloy selected from the group consisting of K, Li, Na, Mg, La, Ce, Ca, Ba, Sm, Eu, alloys thereof, and mixtures thereof, and a plurality of electrically interconnected elongated members that comprise a second electrically conducting material selected from Mg, Al, Ag, In, Sn, Zn, Zr, alloys thereof, and mixtures thereof, and that are disposed on said first layer;
(c) at least an organic EL material disposed between said first electrode and said first layer of said second electrode on a surface of said first layer opposite to the plurality of electrically interconnected elongated members;
wherein a thickness of said elongated members is greater than that of said first layer, said thickness of said elongated members being measured substantially perpendicularly to said first layer.

* * * * *

UNITED STATES PATENT AND TRADEMARK OFFICE
CERTIFICATE OF CORRECTION

PATENT NO. : 7,368,659 B2
APPLICATION NO. : 10/065850
DATED : May 6, 2008
INVENTOR(S) : Christian Maria Anton Heller It is certified that error appears in the above-identified patent and that said Letters Patent is hereby corrected as shown below:

In claim 12, column 12, line 29 [["A right source"]] should be -- A light source --

Signed and Sealed this

Nineteenth Day of August, 2008

JON W. DUDAS
*Director of the United States Patent and Trademark Office*